United States Patent [19]

Velazquez et al.

[11] Patent Number: 4,488,352

[45] Date of Patent: Dec. 18, 1984

[54] APPARATUS FOR ASSEMBLING CIRCUIT COMPONENTS WITH A PRINTED CIRCUIT BOARD

[75] Inventors: Angel M. Velazquez; Eduardo N. Vivas; Joe Rios, all of Mayaguez, P.R.

[73] Assignee: Commonwealth of Puerto Rico, San Juan, P.R.

[21] Appl. No.: 485,854

[22] Filed: Apr. 18, 1983

[51] Int. Cl.³ ............................................... H05K 3/30
[52] U.S. Cl. ......................................... 29/741; 29/838
[58] Field of Search .......... 29/741, 739, 740, 837–839, 29/845

[56] References Cited

U.S. PATENT DOCUMENTS 3,621,554  11/1971  Feldman et al. .................. 29/741 X Primary Examiner—Carl E. Hall
Attorney, Agent, or Firm—Scrivener, Clarke, Scrivener & Johnson

[57] ABSTRACT

Apparatus for connecting a plurality of integrated circuit components to a circuit board positioned within and held by a frame supported on a flat working table, in which the components are held within a magazine and are moved from the magazine into engagement with the circuit board, means being provided for vibrating the table and circuit board to facilitate movement of the components from the magazines to the board and for connecting the components to the board.

10 Claims, 6 Drawing Figures

APPARATUS FOR ASSEMBLING CIRCUIT COMPONENTS WITH A PRINTED CIRCUIT BOARD

SUMMARY OF THE INVENTION

Apparatus for installing electrical integrated circuit components in pre-selected positions on a circuit board comprises a plurality of magazines movably positioned above a circuit board each containing a plurality of components, with means for vibrating the board and magazines and moving the components into engagement with the board, and means for utilizing the pins carried by each component to connect the components to the board.

DESCRIPTION OF THE INVENTION

Figure 1:
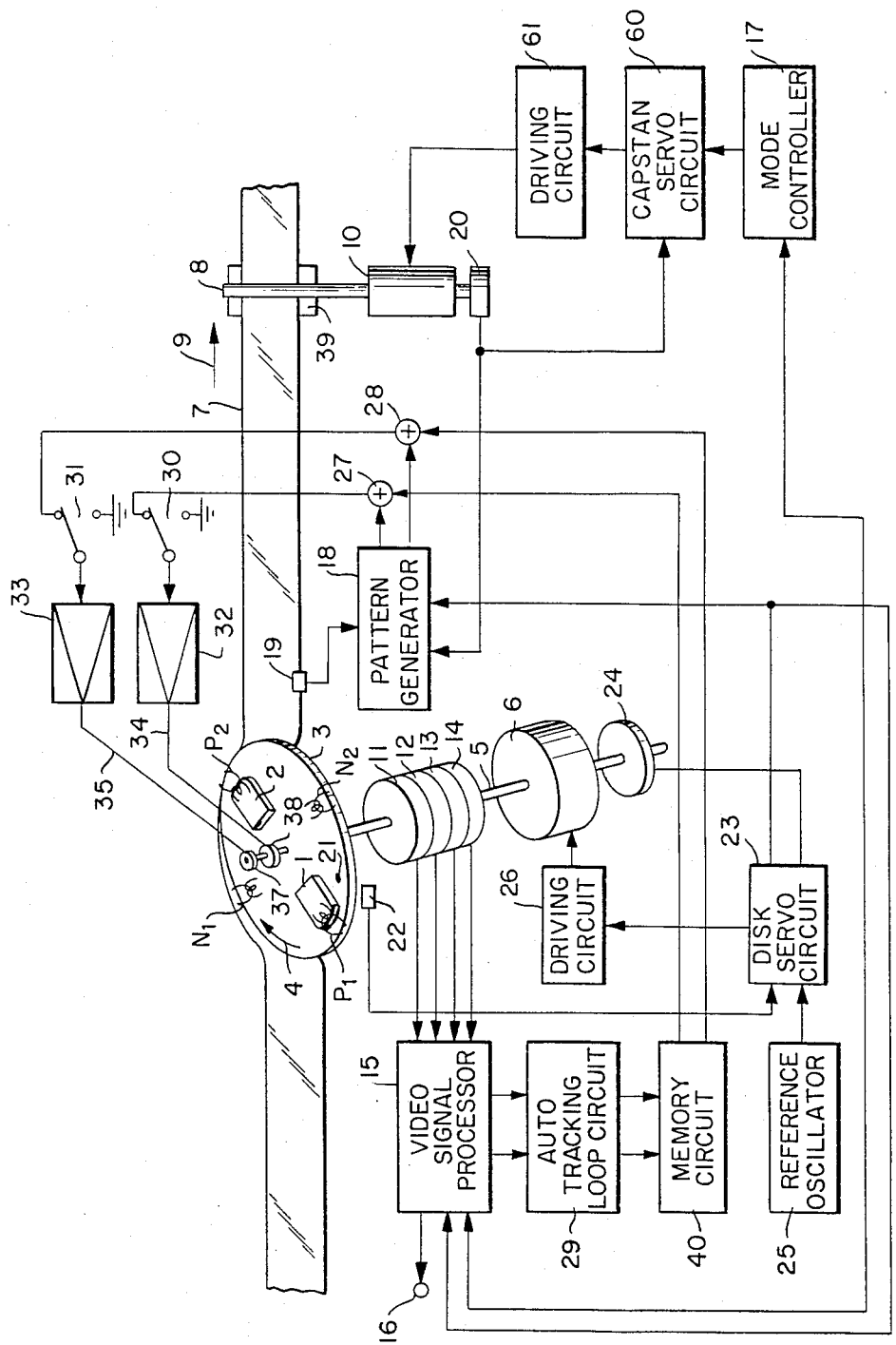
FIG. 1 is a perspective view of the apparatus provided by the invention for assembling electrical circuit components on a circuit board.

The basic elements of the circuit board loading apparatus provided by the invention comprise a means for holding an integrated circuit board in position to receive circuit components, a plurality of magazines, each of which holds a plurality of circuit components, positioned above the circuit board, means for vibrating the board and magazines to facilitate the movement of the components into pre-determined positions on the board, means for moving the circuit components from the magazines to the board, and means for connecting each component to the board.

The means provided by the invention for holding the circuit board takes the form of a working table comprising a lower flat base plate 2 which is adapted to rest on the upper surface of a workbench or the like, and an upper circuit board-supporting plate 4 which is spaced above the lower base plate and is supported on the base plate by a plurality of flexible vertical rods or pillars 6 which are flexible in order to permit the upper plate to be vibrated horizontally with respect to the lower base plate.

Means are provided for supporting and positioning an integrated circuit board on the upper surface of the upper plate, and such means comprise a preferably rectangular frame 8 formed of linear strips 10 which are positioned on the upper surface of the upper supporting plate 4 and may be attached to it, and which will engage and hold the side edges of a circuit board A to which components are to be supplied and connected. It will be understood that the size and shape of the frame 8 will be selected to accommodate the size and shape of the circuit board which is to be supported on the upper surfaces of the upper supporting plate 4, and to permit this the members 10 may be movable and releasably connected to the upper supporting plate.

Means are provided by the invention for assembling a plurality of electrical circuit components B in each of a plurality of magazines 20 and supplying the components from each magazine to the circuit board positioned on the upper surface of the upper plate 4.

Each of these magazines comprises an elongated tube which is of rectangular U-shape in cross sectional shape, having spaced parallel side walls 22 which connected at their upper edges by a top wall 24. Within each magazine and occupying only the upper part thereof is an elongated member 26 which extends substantially from end-to-end of the magazine and from side wall to side wall with its upper surface engaging the lower surface of the top wall 24 of the magazine.

The space within the magazine below the lower surface of the member 26 and between the side walls of the magazine is adapted to receive a plurality of circuit components B arranged in side-by-side relation and extending along the length of the member 26 with their lower surfaces just above the plane of the lower edges of the side walls of the magazine. In order to hold the circuit components within the magazine until they are to be released into engagement with the circuit board a long strip of plastic material 30 is positioned below and in engagement with the lower surface of the circuit components with its side edges resting on flanges 32 extending inwardly from the lower edges of the side walls of the magazine, from which it may be withdrawn when desired to release the circuit components for downward movement into engagement with the circuit board.

In the preferred embodiment of the invention which is disclosed in this specification the magazines required to fill the circuit board are arranged in pairs in side-by-side relation across the upper surface of the frame and the circuit board within the frame, and means are provided for releasably connecting each pair of magazines to the upper supporting member of the table so that each magazine will be properly positioned with respect to the working table, the frame and the circuit board to permit the release of the circuit components to their pre-determined positions on the circuit board, and in the drawings the magazines 20a and 20b of one such pair of magazines are disclosed. The two magazines of each pair are positioned in side-by-side abutting relation and are connected by suitable means, and from one end of the pair there extends an elongated member 34 which is provided at its extremity with an outwardly extending notch or recess 36. At one end of the upper member 4 of the working table there are provided a plurality of pairs of spaced blocks 38, 40 which are arranged in spaced relation across one end of the working table outside the frame 8 and through which, from end to end, there extends a rod 42. It will be seen that each pair of magazines may be assembled to the working table in proper position above the frame and circuit board by inserting the notch over the rod 42 with the elongated member 34 positioned between the blocks 38, 40 of one of the pairs and the magazine positioned above the table. At the opposite end of the working table there are arranged a plurality of alignment blocks 44 which extend in spaced relation across the upper surface of the working table outside the frame. Each of these blocks is provided with a slot 46 which extends toward the frame and at right angles thereto and which is constructed and intended to receive an alignment guide 48 which extends downwardly from the lower surface of the pair of magazines at the end thereof opposite to the end from which the elongated member 34 extends.

Means are provided by the invention for imparting horizontal vibratory movement to the upper member of the work table after all of the magazines are in operative position above the frame and circuit board, and such means comprise an electric motor 50 which is preferably positioned beneath and connected to the upper supporting plate 4 of the working table and which is energized from a source of electricity under the control of a rheostat 52. In accordance with known technology the shaft of the motor may carry an off-center flywheel which, when the motor is operated, will impart horizontal vibratory movement to the upper supporting plate 4, the frame, the magazines and the circuit board, thus facilitating the movement of circuit components into engagement with the board after the plastic strip 30 has been withdrawn from the magazine.

Figure 2:
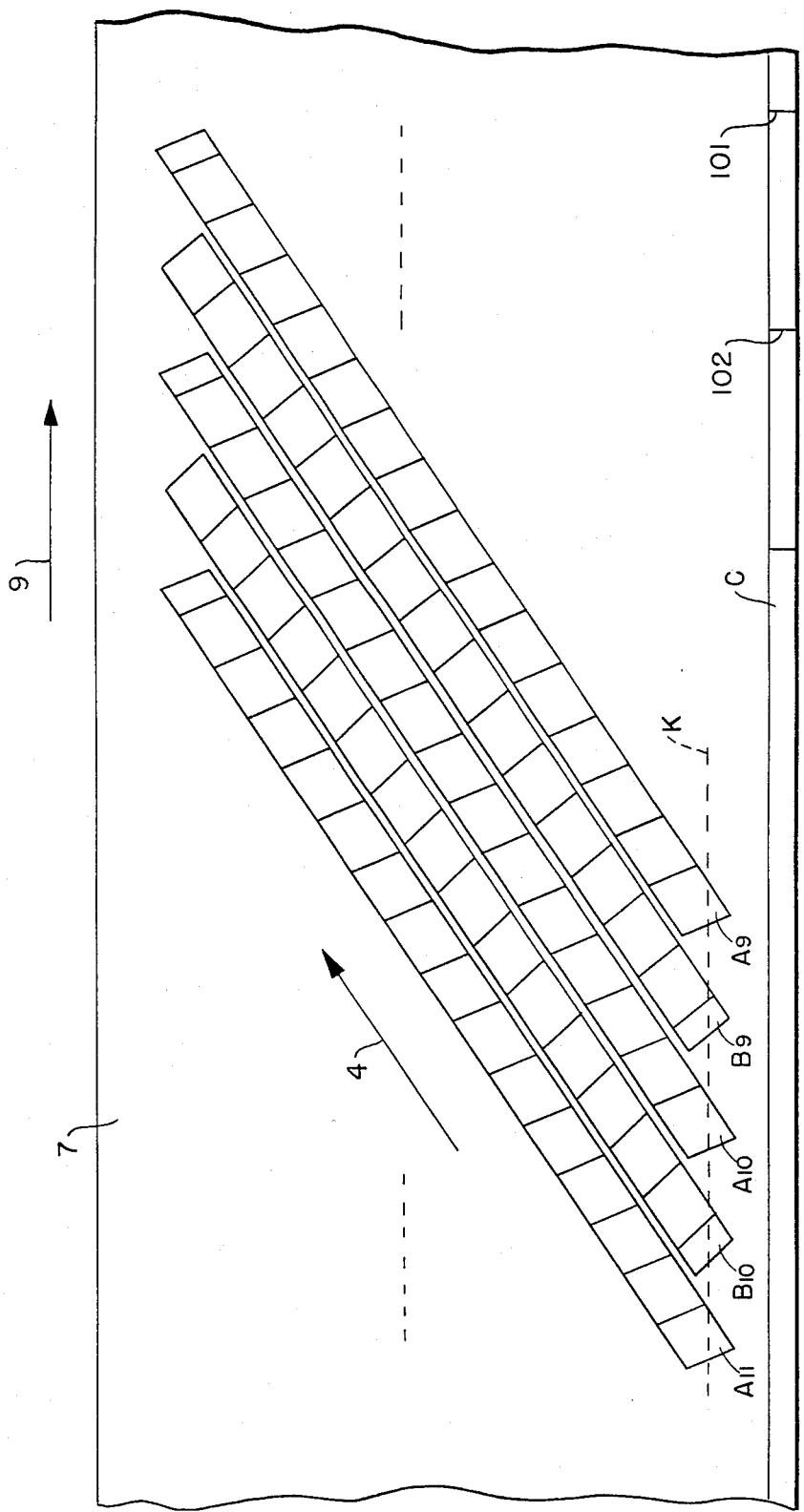
FIG. 2 is a sectional view taken on line 2—2 of FIG. 1.
Figure 3:
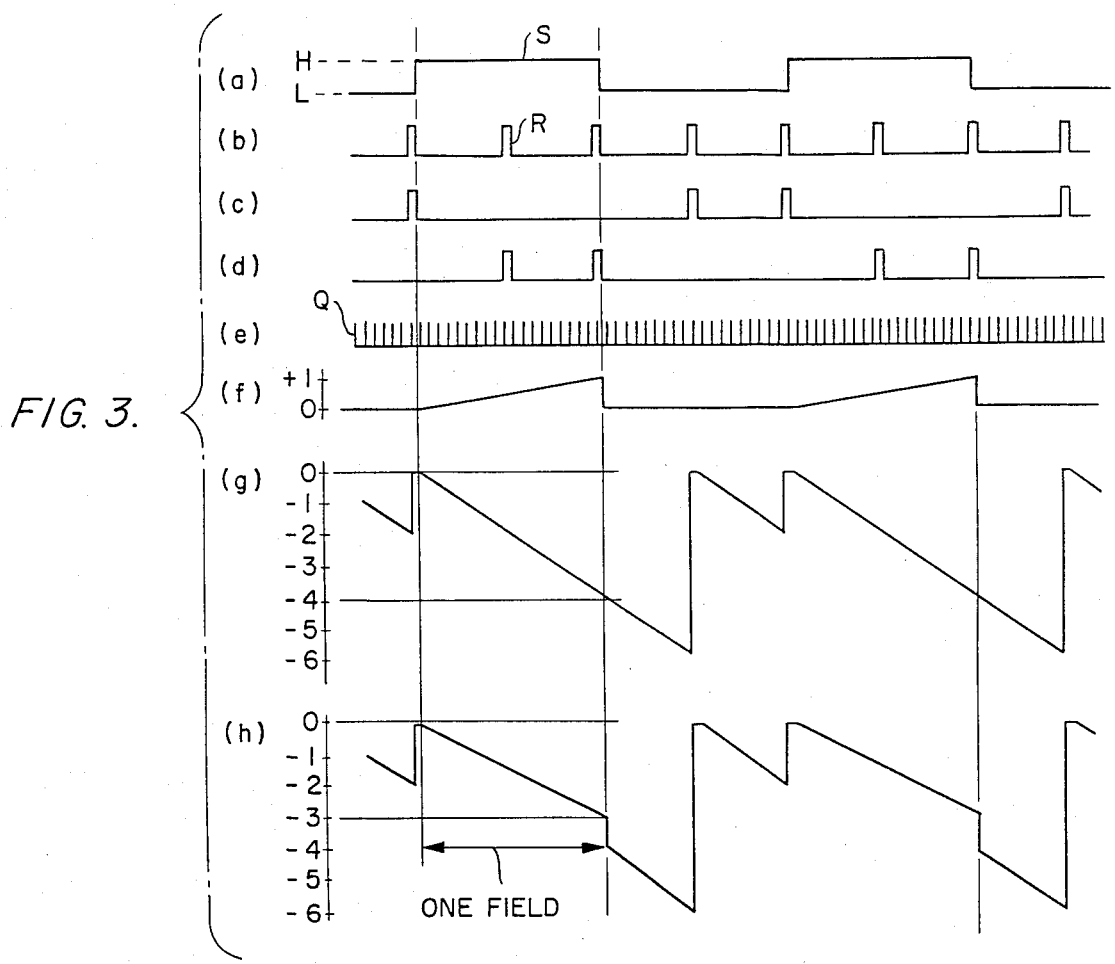
FIG. 3 is an enlarged sectional view taken on line 3—3 of FIG. 2.
Figure 4:
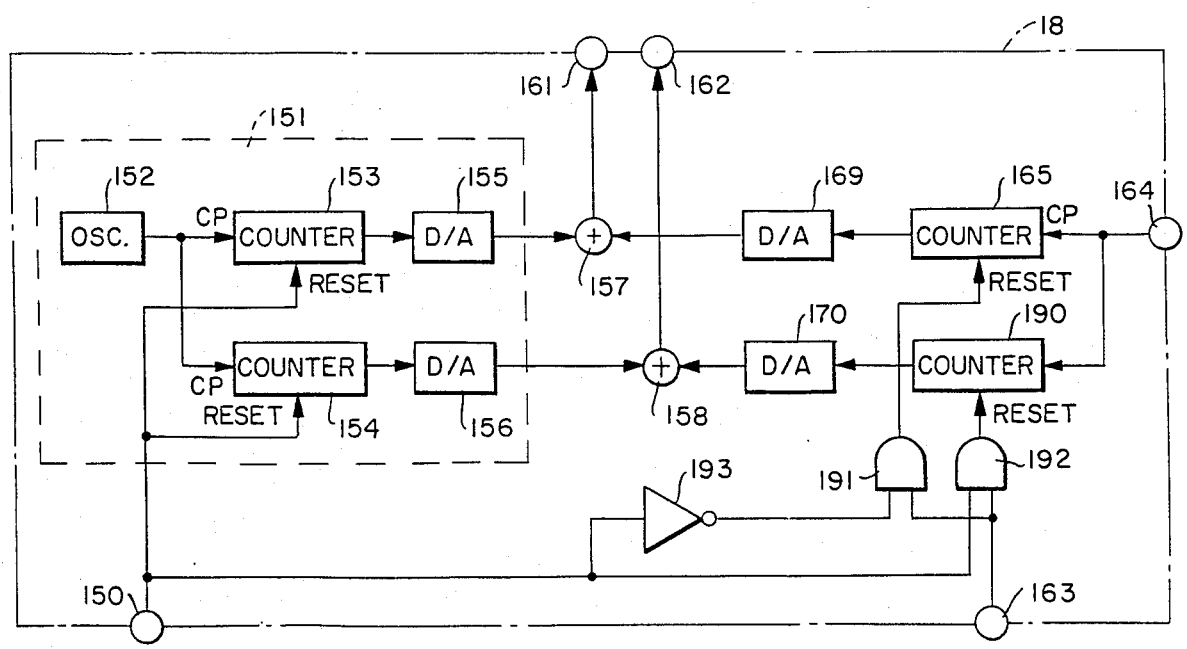
FIG. 4 is a bottom view of a pair of magazines for holding circuit components.

Means are provided by the invention for moving the circuit components in each magazine downwardly into engagement with the circuit board which is supported on the upper member 4. As illustrated in FIGS. 2, 3 and 4 the top wall 24 of each magazine is provided with an elongated opening 60 extending longitudinally of the magazine and centrally of its ends, and above this opening there is provided an elongated pressing handle 62 which is connected to the elongated movable member 26 within the magazine by screws 64, the parts being so constructed and arranged that the pressing handle 62 may be moved downwardly through opening 60 carrying the elongated member 26 with it. The pressing handle has at each of its ends an extension 66 from each of which there extends downwardly a rod 68 which at its lower end is connected to the elongated member 26. A compression spring 70 is positioned between each extension 66 and the upper wall 24 of the magazine and it will be apparent that by pressing down on the handle 62 the elongated member 26 within the magazine will be moved downwardly against the circuit components B and move them from the magazine, and when released will be returned to its normal upper position by the springs.

Figure 5:
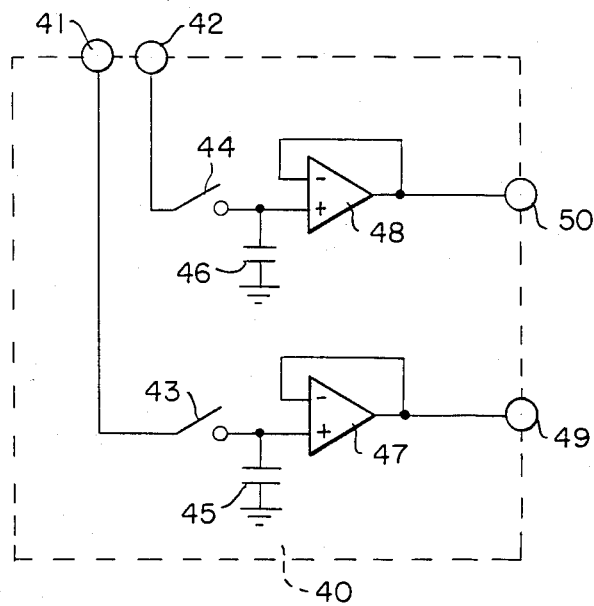
FIG. 5 is a sectional view of the working table and circuit board showing one means for connecting circuit components to the circuit board.

In accordance with known technology each circuit component B is provided with downwardly extending pins 80, and means are provided by the invention for utilizing these pins to connect each circuit component to the circuit board. One such means is illustrated in FIG. 5 and in accordance with this form of the invention a plate 82 formed of a soft material such as styrofoam is positioned beneath the circuit board A within the frame, and when the pressing handle is pushed downwardly to move the circuit component toward and into engagement with the circuit board the pins will pierce the circuit board and embed themselves in the styrofoam plate which will thereby be removed from the frame with the circuit board, thus connecting the circuit components to the board by means of the connection of the pins to the styrofoam plate.

Figure 6:
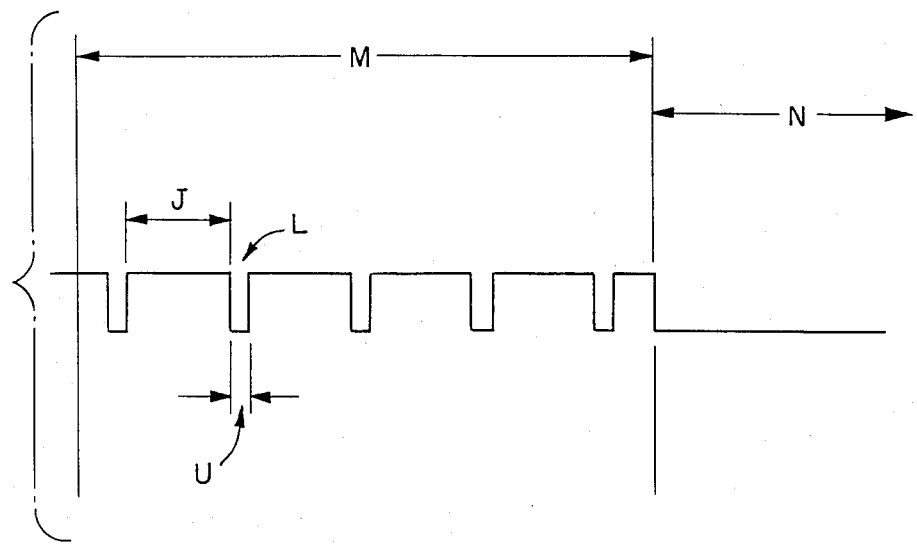
FIG. 6 is a view which is similar to FIG. 4 showing another connecting means.

In another embodiment of the invention which is disclosed in FIG. 6 a plate 90 having its upper surface formed with alternate ridges 92 and grooves 94 is positioned within the frame 8 beneath the circuit board, and when the circuit components are pressed downwardly the pins 80 will pierce the circuit board and plate and engage the inclined side walls of the ridges thus bending the pins and connecting each circuit component to the board. In this embodiment only the circuit board and components will be removed from the frame leaving in place the ridged and grooved plate.

In the use and operation of the apparatus provided by the invention a selected circuit board A is positioned within the frame 8, and each magazine is filled with a plurality of circuit components B arranged in side-by-side relation along the length of the magazine, and the plastic strip 30 is pushed into position between the bottoms of the components and the inturned flanges 32 thus securely holding the circuit components within each magazine. Each pair of magazines is now put into operative position by placing the elongated member 34 between a pair of spaced blocks 38, 40 with its notch 36 positioned over the rod 42. As each pair of magazines is put into position the alignment member 48 extending downwardly from the lower surface of each magazine pair is positioned within a slot 46 in one of the alignment blocks 44. When the magazines are in place the plastic strip 30 holding the circuit components of each magazine in place is withdrawn, the vibrating means 50, 52 is energized and the pressing handle 62 of each magazine is pressed downwardly thereby moving downwardly the upper member 26 of each magazine, with the result that all the circuit bases of each magazine are moved downwardly to their pre-determined positions on the circuit board, the pins 80 either passing into the styrofoam plate 82 or being bent by the ridges 92 of plate 90, in either case connecting the circuit components to the board.

We claim:

1. Apparatus for moving electrical circuit components into engagement with an integrated circuit board, comprising:
   (a) means for supporting a circuit board in horizontal position and holding it from movement,
   (b) means for supporting a plurality of components in elongated longitudinal side-by-side relation above the board,
   (c) releasable means for holding the components from movement toward the board,
   (d) means for imparting vibratory movement to the board and components,
   (e) means operable upon release of the releasable means for moving the components into engagement with the board, and
   (f) means for connecting each component to the board.

2. Apparatus according to claim 1, in which the means for supporting the circuit board comprises a plate having a flat upper surface, and a plurality of linear strips supported on said upper surface and arranged to form a frame surrounding and engaging the side edges of the board.

3. Apparatus according to claim 1, in which the means for supporting the components comprises a plurality of elongated magazines arranged in side-by-side relation and together covering entirely that part of the upper surface of the board to which components are to be supplied.

4. Apparatus according to claim 3, in which each magazine comprises an elongated tube having U-shaped cross sectional shape defined by side walls and a top wall, an elongated member movably mounted within the tube adjacent the top wall and being of less thickness than the depth of the side walls to thereby define a space between the bottom of the member and the edges of the side walls for the reception of a plurality of circuit components arranged in side-by-side relation and extending along the length of the movable member, and resiliently mounted means for moving the elongated movable member in a direction to move the circuit components out of the tube.

5. Apparatus according to claim 4, comprising in addition an elongated strip extending longitudinally of the tube and normally closing the open side thereof and supported for movement along the tube, whereby the strip normally holds the circuit components within the tube but may be withdrawn to release the components.

6. Apparatus according to claim 1, in which the means for supporting the boards comprises spaced upper and lower plates, a frame on the upper surface of the upper plate which is of such size and shape to receive a circuit board, flexible means connecting the upper and lower plates, and means for imparting horizontal vibratory movement to the upper plate.

7. Apparatus according to claim 1 in which each component has pins extending therefrom toward the board, and a plate formed of material which may be pierced by the pins is positioned between the board and its supporting means with its upper and lower surfaces in contact with the board and its supporting means.

8. Apparatus according to claim 7 in which the plate beneath the board is formed of styrofoam.

9. Apparatus according to claim 1, in which each component has pins extending therefrom toward the board, and a plate having an upper surface formed with spaced parallel ridges of trapezoidal cross sectional shape is positioned between the board and its supporting means with its upper and lower surfaces in contact with the board and its supporting means.

10. Apparatus for dispensing integrated circuit bases to pre-selected locations on an integrated circuit board, comprising:
 (a) a table having a flat upper surface,
 (b) a frame comprising sides positioned on the upper surface of the table shaped to receive an integrated circuit board,
 (c) a plurality of magazines removably connected to the upper surface of the table above the frame,
 (d) each of the magazines being elongated and of inverted U-shape in cross section for the reception of a plurality of integrated circuit bases in side-by-side relation along the length of the magazine,
 (e) removable means for holding the circuit bases in their respective mazagines preparatory to dispensing, and
 (f) means for pressing the bases within each magazine into engagement with a circuit board within the frame.

* * * * *